(12) United States Patent
Wang et al.

(10) Patent No.: US 10,378,108 B2
(45) Date of Patent: Aug. 13, 2019

(54) SHOWERHEAD WITH REDUCED BACKSIDE PLASMA IGNITION

(71) Applicant: Applied Materials, Inc., Santa Clara, CA (US)

(72) Inventors: Haitao Wang, Fremont, CA (US); Hamid Noorbakhsh, Fremont, CA (US); Chunlei Zhang, Saratoga, CA (US); Sergio Fukuda Shoji, San Jose, CA (US); Kartik Ramaswamy, San Jose, CA (US); Roland Smith, Sunnyvale, CA (US); Brad L. Mays, Findlay, OH (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 383 days.

(21) Appl. No.: 15/219,758

(22) Filed: Jul. 26, 2016

(65) Prior Publication Data
US 2017/0101713 A1 Apr. 13, 2017

Related U.S. Application Data

(60) Provisional application No. 62/239,242, filed on Oct. 8, 2015.

(51) Int. Cl.
| | |
|---|---|
| *C23C 16/455* | (2006.01) |
| *C23C 16/44* | (2006.01) |
| *H01J 37/32* | (2006.01) |

(52) U.S. Cl.
CPC .... *C23C 16/45565* (2013.01); *C23C 16/4401* (2013.01); *H01J 37/3244* (2013.01)

(58) Field of Classification Search
CPC .......... C23C 16/45565; C23C 16/4401; H01J 37/3244
(Continued)

(56) References Cited

U.S. PATENT DOCUMENTS

| | | | | |
|---|---|---|---|---|
| 3,603,284 A | * | 9/1971 | Garnache | ............ C23C 16/4588 |
| | | | | 118/725 |
| 6,451,157 B1 | * | 9/2002 | Hubacek | ........... C23C 16/45565 |
| | | | | 156/345.17 |

(Continued)

FOREIGN PATENT DOCUMENTS

KR 1020120082640 7/2012

OTHER PUBLICATIONS

International Search Report dated Oct. 26, 2016 for Application No. PCT/US2016/044080.

*Primary Examiner* — Rudy Zervigon
(74) *Attorney, Agent, or Firm* — Patterson + Sheridan LLP

(57) ABSTRACT

Embodiments of the present disclosure relate to a showerhead assembly for use in a processing chamber. The showerhead assembly includes a porous insert disposed in a space defined between a gas distribution plate and a base plate to moderate the corrosive radicals resulting from plasma ignition to reduce particle issues and metal contamination in the chamber. The porous insert is a conductive material, such as metal, used to reduce the gap electrical field strength, or may be a dielectric material such as ceramic, polytetrafluoroethylene, polyamide-imide, or other materials with a low dielectric loss and high electrical field strength under conditions of high frequency and strong electric fields. As such, the electrical breakdown threshold is enhanced. The porous insert may reduce and/or eliminate showerhead backside plasma ignition and may include multiple concentric narrow rings that cover gas holes of the gas distribution plate.

20 Claims, 3 Drawing Sheets

(58) Field of Classification Search
USPC .................. 118/715; 156/345.33, 345.34
See application file for complete search history.

(56) References Cited

U.S. PATENT DOCUMENTS

| | | | |
|---|---|---|---|
| 6,502,530 B1 | 1/2003 | Turlot et al. | |
| 6,872,258 B2* | 3/2005 | Park | C23C 16/45565 118/715 |
| 7,846,292 B2* | 12/2010 | Han | H01J 37/3244 118/715 |
| 8,484,847 B2* | 7/2013 | Huang | B05B 1/185 29/890.142 |
| 9,117,635 B2* | 8/2015 | Satoh | H01J 37/3244 |
| 2003/0019580 A1* | 1/2003 | Strang | C23C 16/45565 156/345.33 |
| 2004/0082251 A1* | 4/2004 | Bach | C23C 16/45563 445/60 |
| 2005/0109460 A1* | 5/2005 | DeDontney | C23C 16/45565 156/345.33 |
| 2005/0173569 A1 | 8/2005 | Noorbakhsh et al. | |
| 2006/0219362 A1* | 10/2006 | Han | C23C 16/45565 156/345.33 |
| 2006/0266852 A1* | 11/2006 | Choi | B05B 1/185 239/548 |
| 2008/0178805 A1* | 7/2008 | Paterson | H01J 37/32091 118/723 I |
| 2009/0246374 A1* | 10/2009 | Vukovic | C23C 16/45563 427/255.28 |
| 2010/0184298 A1* | 7/2010 | Dhindsa | H01J 37/3244 438/710 |
| 2010/0230387 A1* | 9/2010 | Okesaku | C23C 16/45565 216/69 |
| 2011/0049102 A1 | 3/2011 | Kroll et al. | |
| 2013/0174783 A1* | 7/2013 | Suzuki | C23C 16/45565 118/725 |
| 2014/0116470 A1 | 5/2014 | Su et al. | |
| 2014/0209027 A1* | 7/2014 | Lubomirsky | B05B 1/005 118/724 |
| 2016/0005571 A1* | 1/2016 | Della Rosa | H01J 37/3288 156/345.34 |
| 2017/0243724 A1* | 8/2017 | Noorbakhsh | H01J 37/3244 |

* cited by examiner

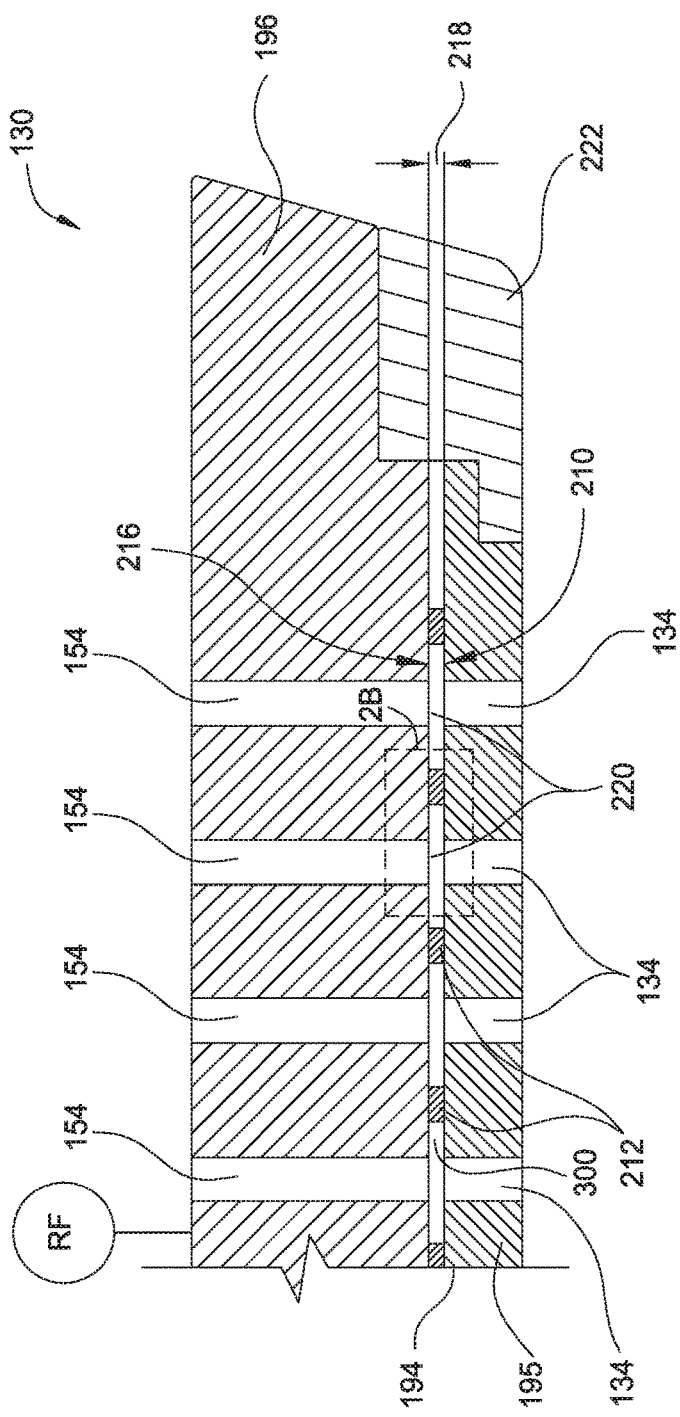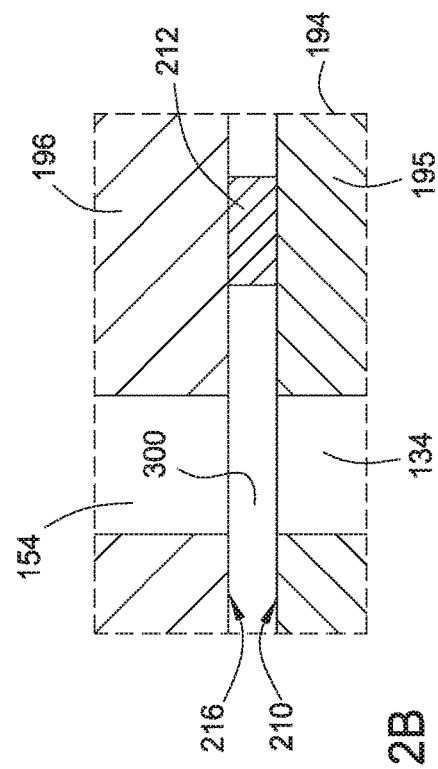

SHOWERHEAD WITH REDUCED BACKSIDE PLASMA IGNITION

CROSS-REFERENCE TO RELATED APPLICATIONS

This application claims benefit to U.S. Provisional Patent Application No. 62/239,242, filed Oct. 8, 2015, the entirety of which is hereby incorporated by reference.

FIELD

Embodiments of the present disclosure generally relate to a semiconductor processing chamber, and more specifically, to a showerhead assembly suitable for reducing showerhead backside plasma ignition.

BACKGROUND

Semiconductor processing involves a number of different chemical and physical processes wherein minute integrated circuits are created on a substrate. Layers of materials which make up the integrated circuit are created by chemical vapor deposition, physical vapor deposition, epitaxial growth, and the like. Some of the layers of material are patterned using photoresist masks and wet or dry etching techniques. The substrate utilized to form integrated circuits may be silicon, gallium arsenide, indium phosphide, glass, or any other appropriate materials.

A typical semiconductor processing chamber may have many components. Some components include a chamber body defining a process zone, a gas distribution assembly adapted to supply a process gas from a gas supply into the process zone, a gas energizer, e.g., a plasma generator, utilized to energize the process gas within the process zone, a substrate support assembly, and a gas exhaust. Some components may be comprised of an assembly of parts. For example, a showerhead assembly may include a conductive base plate bonded to a ceramic gas distribution plate.

Prior showerheads have issues of plasma ignition in the gap between the gas distribution plate and the base plate when exposed to high RF electric field conditions. The plasma may ignite thus causing discolorations of the gas distribution plate and the base plate. Plasma ignitions have generally occurred when higher powers are sought, such as above 2000 watts. The discharged process gases cause polymer deposition on the exposed surfaces of the gas distribution plate and the base plate. The corrosive radicals not only attack the gasket seals or the bonding material of the showerhead assembly, thus resulting in bond seal erosion and/or gasket seal erosion and the loosening of thermal contact, but also attack the anodized base plate and other such protective coatings. The accumulated polymers, loosened bond filler, and/or particles of anodized material may pass through the gas holes of the gas distribution plate and into the plasma chamber, thus causing particle issues and contamination.

Therefore, what is needed in the art is an improved showerhead assembly to reduce backside plasma ignition.

SUMMARY

In one embodiment, a showerhead assembly for use in a processing chamber is disclosed. The showerhead assembly includes a gas distribution plate, a base plate, and a porous insert. The gas distribution plate has a plurality of gas holes extending through a first surface of the gas distribution plate. The base plate has at least one or more gas delivery holes extending through a first surface of the base plate. The first surface of the base plate and the first surface of the gas distribution plate define a space therebetween. The porous insert is located in the space. A gas flow path through the showerhead assembly is defined through the one or more gas delivery holes extending through the base plate, the porous insert, and the gas holes of the gas distribution plate.

In another embodiment, a processing chamber for processing substrates is disclosed that includes a showerhead assembly. The showerhead assembly includes a gas distribution plate, a base plate, a space defined between the gas distribution plate and the base plate, and a porous insert located within the space.

In yet another embodiment, a gas distribution plate is disclosed. The gas distribution plate includes a disk-shaped body, a first zone defined in the body, a second zone defined in the body, a plurality of circular gasket seals, and a first porous insert. The first zone includes a first plurality of gas holes extending through the body. The first porous insert covers the first plurality of gas holes. The second zone encircles the first zone and includes a second plurality of gas holes extending through the body. The plurality of circular gasket seals are coupled with the gas distribution plate and seated concentrically within the first zone and the second zone.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. It is to be noted, however, that the appended drawings illustrate only typical embodiments of this disclosure and are therefore not to be considered limiting of its scope, for the disclosure may admit to other equally effective embodiments.

FIG. 2A schematically illustrates a cross-sectional view of a showerhead, according to one embodiment described herein.

FIG. 2B schematically illustrates an enlarged section of the showerhead of FIG. 2A, according to one embodiment described herein.

Figure 1:
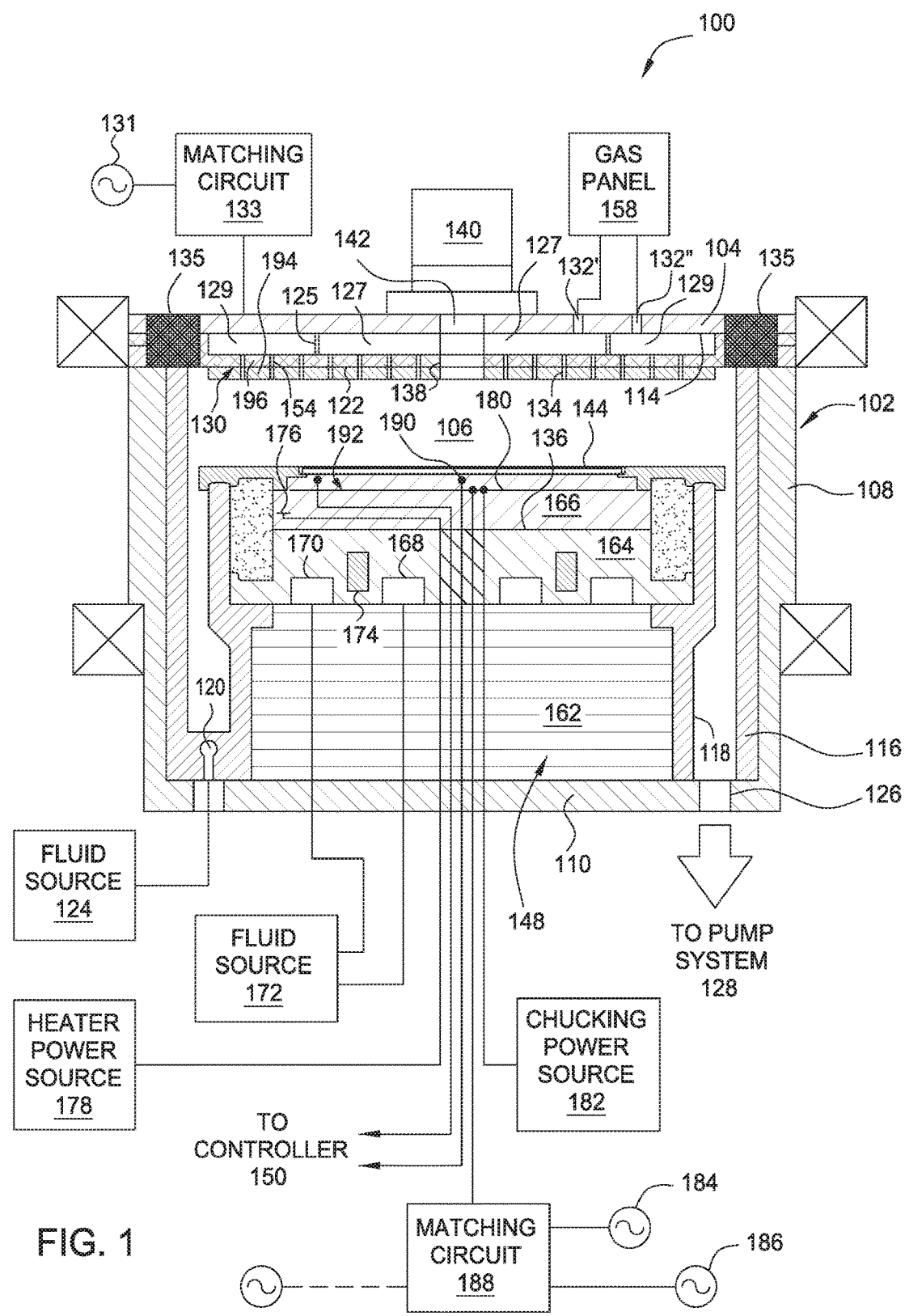
FIG. 1 illustrates a sectional view of one embodiment of a processing chamber, according to one embodiment described herein.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Embodiments of the present disclosure provide a showerhead assembly for use in a processing chamber. The showerhead assembly includes a porous insert in the space between the gas distribution plate and the base plate to moderate the corrosive radicals resulting from plasma ignition to reduce particle issues and metal contamination in the chamber. The porous insert may be a conductive material, such as metal, used to reduce the gap electrical field strength, or may be a dielectric material such as ceramic, polytetrafluoroethylene, polyamide-imide, or other materials having a low dielectric loss and high electrical field strength under conditions of high frequency and strong electric fields. As such, the electrical breakdown threshold is enhanced. The porous insert may reduce and/or eliminate showerhead backside plasma ignition and may include multiple concentric narrow rings that cover gas holes of the gas distribution plate.

FIG. 1 is a sectional view of one embodiment of a semiconductor processing chamber 100 according to the present disclosure. One example of suitable processing chambers 100 may include the CENTURA® ENABLER™ Etch System, available from Applied Materials, Inc. of Santa Clara, Calif. It is contemplated that other processing chambers may be adapted to benefit from one or more of the inventive techniques disclosed herein, including those from other manufacturers.

The processing chamber 100 includes a chamber body 102 and a lid 104 which enclose an interior volume 106. The chamber body 102 is typically fabricated from aluminum, stainless steel, or other suitable material. The chamber body 102 generally includes side walls 108 and a bottom 110. A substrate access port (not shown) is generally defined in a side wall 108 and is selectively sealed by a slit valve to facilitate entry and egress of the substrate 144 from the processing chamber 100. An outer liner 116 may be positioned against on the side walls 108 of the chamber body 102. The outer liner 116 may be fabricated and/or coated with a plasma or halogen-containing gas resistant material.

An exhaust port 126 is defined in the chamber body 102 and couples the interior volume 106 to a pump system 128. The pump system 128 generally includes one or more pumps and throttle valves utilized to evacuate and regulate the pressure of the interior volume 106 of the processing chamber 100.

The lid 104 is sealingly supported on the side wall 108 of the chamber body 102. The lid 104 may be opened to allow excess to the interior volume 106 of the processing chamber 100. The lid 104 may optionally include a window 142 that facilitates optical process monitoring. In one embodiment, the window 142 is comprised of quartz or other suitable material that is transmissive to a signal utilized by an optical monitoring system 140. One optical monitoring system that may be adapted to benefit from the disclosure is the EyeD® full-spectrum, interferometric metrology module, available from Applied Materials, Inc., of Santa Clara, Calif.

A gas panel 158 is coupled to the processing chamber 100 to provide process and/or cleaning gases to the interior volume 106. Examples of processing gases may include halogen-containing gas, such as $C_2F_6$, $SF_6$, $SiCl_4$, HBr, $NF_3$, $CF_4$, $Cl_2$, $CHF_3$, $CF_4$, and $SiF_4$, among others, and other gases such as $O_2$, or $N_2O$. Examples of carrier gases include $N_2$, He, Ar, and/or other gases inert to the process and non-reactive gases. In the embodiment depicted in FIG. 1, inlet ports 132', 132" (collectively ports 132) are provided in the lid 104 to allow gases to be delivered from the gas panel 158 to the interior volume 106 of the processing chamber 100 through a showerhead assembly 130.

The showerhead assembly 130 is coupled to an interior surface 114 of the lid 104. The showerhead assembly 130 includes a gas distribution plate 194 coupled to a conductive base plate 196. In some embodiments, the gas distribution plate 194 may be bonded or clamped to the conductive base plate 196. The conductive base plate 196 may serve as an RF electrode. In one embodiment, the conductive base plate 196 may be fabricated by aluminum, stainless steel or other suitable materials. The gas distribution plate 194 may be fabricated from a silicon crystal material and/or a ceramic material, such as silicon carbide, bulk Yttrium, or yttria to provide resistance to halogen-containing chemistries. Alternatively, the gas distribution plate 194 may be coated with Yttrium or yttria to extend the service life of the showerhead assembly 130.

The conductive base plate 196 may be bonded or clamped to the gas distribution plate 194 by a thermal gasket and/or an adhesive material 122.

The gas distribution plate 194 may be a flat disk-shaped body 195. A plurality of gas holes 134 may be formed through the body 195 of the gas distribution plate 194 and may exit a lower surface of the gas distribution plate 194 facing toward the substrate 144. The gas holes 134 of the gas distribution plate 194 align with corresponding gas holes 154 formed through the conductive base plate 196. The alignment may allow the gases to flow from the inlet port 132 (shown as 132', 132") through one or more plenums (shown as 127, 129) into the interior volume 106 of the processing chamber 100 in a predefined distribution across the surface of the substrate 144 being processed in the chamber 100.

The showerhead assembly 130 may include dividers 125 disposed between the lid 104 and the conductive base plate 196 that separate an inner plenum 127 and an outer plenum 129. The inner plenum 127 and the outer plenum 129 formed in the showerhead assembly 130 may assist in preventing the mixing of gases provided from the gas panel prior to passing through the gas distribution plate 194. When dividers 125 are used, a corresponding layer of adhesive material 122 is disposed between the gas distribution plate 194 and the conductive base plate 196 to isolate the gases provided to each plenum 127, 129 while passing through the gas distribution plate 194 and into the interior volume 106. Furthermore, the showerhead assembly 130 may further include a region transmissive or passage 138 suitable for allowing the optical monitoring system 140 to view the interior volume 106 and/or substrate 144 positioned on the substrate support assembly 148. The passage 138 includes a window 142 to prevent gas leakage from the passage 138.

In certain embodiments, the showerhead assembly 130 may be electrically floated. One or more RF power sources 131 may be coupled with an RF electrode, such as the conductive base 196, via a matching circuit 133. The RF power source 131 is generally capable of producing an RF signal. The RF power source 131 may produce an electrical voltage between the base plate 196 and the gas distribution plate 194, thus causing a backside plasma ignition. Furthermore, the showerhead assembly 130 may include an insulator 135.

A substrate support assembly 148 is disposed in the interior volume 106 of the processing chamber 100 below the showerhead assembly 130. The substrate support assembly 148 holds the substrate 144 during processing. The substrate support assembly 148 generally includes a plurality of lift pins (not shown) disposed therethrough that are configured to lift the substrate 144 from the support assembly 148 and facilitate exchange of the substrate 144 with a robot (not shown) in a conventional manner. An inner liner 118 may be coated on the periphery of the substrate support assembly 148. The inner liner 118 may be a halogen-containing gas resistant material which is substantially similar to material used for the outer liner 116. In one embodiment, the inner liner 118 may be fabricated from the same material as that of the outer liner 116. The inner liner 118 may include an internal conduit 120 through which a heat transfer fluid is provided from a fluid source 124 to regulate the temperature of the In one embodiment, the substrate support assembly 148 includes a mounting plate 162, a base 164 and an electrostatic chuck 166. At least one of the base 164 or chuck 166 may include at least one optional embedded heater 176, at least one optional embedded isolator 174 and a plurality of conduits 168, 170 to control the lateral temperature profile of the support assembly 148. The conduits 168, 170 are fluidly coupled to a fluid source 172 that circulates a temperature regulating fluid therethrough. The heater 176 is regulated by a power source 178. The conduits 168, 170 and heater 176 are utilized to control the temperature of the base 164, thus heating and/or cooling the electrostatic chuck 166. The temperature of the electrostatic chuck 166 and the base 164 may be monitored using a plurality of temperature sensors 190, 192.

The electrostatic chuck 166 comprises at least one clamping electrode 180 controlled using a chucking power source 182. The electrode 180 (or other electrode disposed in the chuck 166 or base 164) may further be coupled to one or more RF power sources 184, 186 through a matching circuit 188 for maintaining a plasma formed form process and/or other gases within the processing chamber 100. The sources 184, 186 are generally capable of producing an RF signal having a frequency from about 50 kHz to about 3 GHz and a power of up to about 10,000 Watts.

The base 164 is secured to the electrostatic chuck 166 by a bonding material 136, which may be substantially similar or the same as the adhesive material 122 utilized to bond the gas distribution plate 194 and the conductive base plate 196 in the showerhead assembly 130.

FIG. 2A illustrates a cross-sectional view of the showerhead assembly 130 of FIG. 1. As stated above, the showerhead assembly 130 includes a gas distribution plate 194 coupled to a conductive base plate 196. The gas distribution plate 194 may be fabricated from a silicon containing material. The gas distribution plate 194 may have a plurality of gas holes 134 extending through a first surface 210 of the gas distribution plate 194. Each gas hole 134 may have a diameter between about 0.001 inches and about 0.2 inches. The gas distribution plate 194 may have a plurality of gasket seals 212 coupled with the first surface 210 of the gas distribution plate 194. In some embodiments, the gasket seals 212 may be thermal gasket seals. In some embodiments, the gasket seals 212 may be concentric. The gasket seals 212 may compress when the base plate 196 is clamped to the gas distribution plate 194. In some embodiments, the gasket seals 212 may comprise a silicone type material. In some embodiments, the gasket seals 212 may comprise about 80% alumina material. The gas distribution plate 194 may comprise a plurality of filler rings 220 near the first surface 210 of the gas distribution plate 194. In some embodiments, the filler rings 220 may be porous filler rings. In some embodiments, the filler rings 220 may be polyamide-imide filler rings. In certain embodiments, the filler rings 220 may be porous polyamide-imide filler rings.

The base plate 196 may comprise an aluminum material. In some embodiments, the base plate 196 may comprise a porous Teflon material. The base plate 196 has at least one or more gas holes 154 extending through a first surface 216 of the base plate 196. The first surface 210 of the gas distribution plate 194 and the first surface 216 of the base plate 196 may be coupled together with a clamp 222. In some embodiments the clamp 222 may comprise an aluminum material. The coupling of the first surface 210 of the gas distribution plate 194 and the first surface 216 of the base plate 196 may define a space 218 between the first surface 210 of the gas distribution plate 194 and the first surface 216 of the base plate 196 in which the plenums 127, 129 are defined. The space 218 has a height of between about 0.01 inches and about 0.2 inches, for example between about 0.02 inches and about 0.1 inches.

FIG. 2B schematically illustrates an enlarged cross-sectional view of a section of the showerhead assembly 130 of FIG. 2A. As shown in FIG. 2B, in certain embodiments, an insert 300 may be inserted in the space 218 defined between the first surface 210 of the gas distribution plate 194 and the first surface 216 of the base plate 196.

Figure 3:
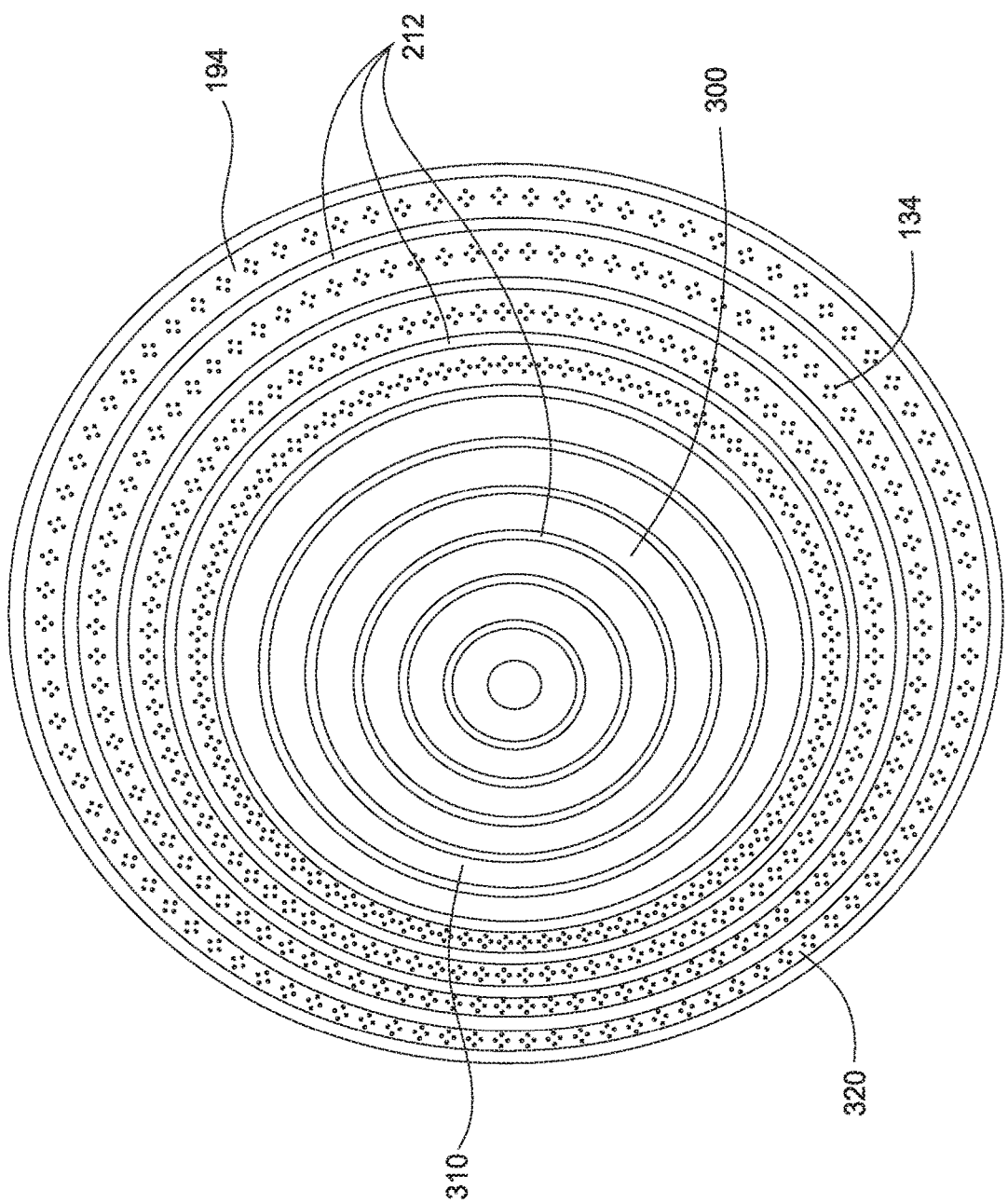
FIG. 3 schematically illustrates a gas distribution plate of the showerhead with a porous insert, according to one embodiment described herein.

FIG. 3 schematically illustrates an insert 300 coupled with the gas distribution plate 194. The insert 300 may be inserted in the space 218 between the first surface 210 of the gas distribution plate 194 and the first surface 216 of the base plate 196. In some embodiments, the insert 300 may be porous. The insert 300 may comprise a conductive material, such as metal. The conductive material may reduce the gap electrical field strength. In other embodiments, the insert 300 may comprise dielectric material, such as ceramic, polytetrafluoroethylene, polyamide-imide, or other such materials with a low dielectric loss and/or a high electrical field strength under conditions of high frequency and strong electric fields. As such, the electrical breakdown threshold may be enhanced. In some embodiments, the insert 300 comprises a plurality of concentric rings located between the plurality of gaskets seals 212. The insert 300 may have a pore size of between about 2 micrometers and about 200 micrometers, for example between about 5 micrometers and about 120 micrometers. In certain embodiments in which a porous insert is utilized, the insert 300 may have a porosity of between about 15% and about 75%, for example between about 20% and about 70%. The insert 300 may be ring-shaped and/or may match the shape of the showerhead assembly 130. Additionally, the insert 300 may be a layer of material coating the top side of the gas distribution plate.

As shown in the embodiment of FIG. 3, the insert 300 may comprise multiple concentric narrow rings to cover the gas holes 134 of the gas distribution plate 194. As such, the insert 300 may be ring shaped. The insert 300 may screen to prevent plasma ignition within the showerhead assembly 130.

In certain embodiments, the showerhead assembly 130 may comprise a gas distribution plate 194 comprising a plurality of zones formed in the body 195, such as a first zone 310 and a second zone 320. The first zone 310 may be an inner zone and the second zone 320 may be an outer zone, wherein the second zone 320 encircles the first zone 310. The first zone 310 of the gas distribution plate 194 may include a first plurality of gas holes 312 extending through the body 195 of the gas distribution plate 194. The second zone 320 may comprise a second plurality of gas holes 322 extending through the body 195 of the gas distribution plate 194. The first plurality of gas holes 312 and the second plurality of gas holes 322 may be similar to the gas holes 134 described supra. The gas distribution plate 194 may further include a plurality of gasket seals 212 coupled with the gas distribution plate 194 and seated concentrically within each of the plurality of zones, such as the first zone 310 and the second zone 320. The gasket seals 212 may compress when the base plate 196 is clamped with the gas distribution plate 194. In some embodiments, the gasket seals 212 may comprise a silicone material. In some embodiments, the gasket seals 212 may comprise about 80% alumina material. The insert 300 may be located within the first zone 310, such that the insert covers the first plurality of gas holes 312. The insert 300 may be a porous insert. In some embodiments the porous insert 300 may be a conductive material. In some embodiments, the porous insert 300 may be a dielectric material. In certain embodiments, the porous insert 300 has a pore size of between about 2 micrometers and about 200 micrometers, for example between about 5 micrometers and about 120 micrometers. In certain embodiments, the porous insert 300 has a porosity of between about 15% and about 75%, for example between about 20% and about 70%. In certain embodiments, a gas may flow through the insert 300 and out of the first plurality of gas holes 312 and/or the second plurality of gas holes 322.

In some embodiments, the second zone 320 may include a second insert, wherein the second insert is similar to insert 300, described supra. As such, the second insert may cover the second plurality of gas holes 322.

It is contemplated that the showerhead assembly 130 may comprise any number of zones, such as one zone, two zones, or more than two zones. The zones may be concentric. It is also contemplated the insert 300 may be disposed in any of the zones. For example, in the embodiment of FIG. 3, the first zone 310 may comprise the insert 300, while the second zone 320 does not comprise an insert 300; the second zone 320 may comprise the insert 300, while the first zone 310 does not comprise an insert 300; and/or each of the first zone 310 and the second zone 320 may each comprise inserts 300. It is also contemplated that in some embodiments a partial area of the first zone 310 and/or second zone 320 may be covered by one or more inserts 300, while the remaining area is free of inserts 300.

Benefits of the present disclosure include that the insert is inexpensive to manufacture and produce, thus reducing costs. Typical gas distribution assemblies need cleaning after about 600 RF hours, however, the showerhead assembly disclosed herein needs much less cleaning. Additional benefits may include a reduction in or the elimination of particles or contaminants therein and in the processing chamber, and an increase in service interval of the processing chamber as fewer cleanings are needed. The showerhead assembly disclosed herein may reduce and/or eliminate backside ignition, arcing, and particles within the showerhead vis-à-vis the inclusion of the insert in the space between the gas distribution plate and the base plate. Furthermore, testing has been completed and the use of a porous insert reduces the space to below 0.025 inches. Testing has been completed and the results have shown that plasma ignition is prevented at higher sources of power, such as those above about 2.5 kW.

While the foregoing is directed to embodiments of the disclosure, other and further embodiments of the disclosure may be devised without departing from the basic scope thereof, and the scope thereof is determined by the claims that follow.

The invention claimed is:

1. A gas distribution plate, comprising:
   a disk-shaped body having a center axis;
   a first zone defined in the body, the first zone comprising
      a first plurality of gas holes extending through the body, the first plurality of gas holes arranged in a circle around the center axis;
   a second zone defined in the body and encircling the first zone, the second zone comprising a second plurality of gas holes extending through the body, the second plurality of gas holes arranged in a circle around the center axis;
   a plurality of circular gasket seals positioned on the gas distribution plate and positioned concentrically around the center axis and within the first zone and the second zone; and
   a first ring shaped porous insert positioned over the first plurality of gas holes, wherein the ring shaped porous insert is positioned between two of the plurality of circular gasket seals.

2. The gas distribution plate of claim 1, further comprising:
   a second ring shaped porous insert covering the second plurality of gas holes.

3. The gas distribution plate of claim 1, wherein the first ring shaped porous insert is an electrically conductive material.

4. The gas distribution plate of claim 1, wherein the first ring shaped porous insert has an average pore size of between about 5 micrometers and about 120 micrometers.

5. The gas distribution plate of claim 1, wherein the first ring shaped porous insert is a dielectric material.

6. The gas distribution plate of claim 1, wherein the first ring shaped porous insert has a porosity of between about 20% and about 70%.

7. The gas distribution plate of claim 1, wherein the gas distribution plate comprises a silicon containing material.

8. The gas distribution plate of claim 2, wherein the second porous insert is an electrically conductive material.

9. The gas distribution plate of claim 2, wherein the second porous insert is a dielectric material.

10. The gas distribution plate of claim 2, wherein the second porous insert has an average pore size of between about 5 micrometers and about 120 micrometers.

11. The gas distribution plate of claim 2, wherein the second porous insert has a porosity of between about 20% and about 70%.

12. A gas distribution plate, comprising:
   a disk-shaped body having a center axis;
   a first zone defined in the body, the first zone comprising:
      a first plurality of gas holes extending through the body and arranged in a first circle around the center axis; and
      a second plurality of gas holes extending through the body and arranged in a second circle around the center axis;
   a second zone defined in the body and encircling the first zone, the second zone comprising:
      a third plurality of gas holes extending through the body and arranged in a third circle around the center axis; and
      a fourth plurality of gas holes extending through the body and arranged in a fourth circle around the center axis;
   a plurality of circular gasket seals positioned on the gas distribution plate within the first zone and the second zone, wherein the plurality of circular gasket seals are positioned concentrically around the center axis;
   a first ring shaped porous insert positioned over the first circle of gas holes of the first plurality of gas holes; and
   a second ring shaped porous insert positioned over the second circle of gas holes of the first plurality of gas holes,
   wherein each of the ring shaped porous inserts are positioned between two gasket seals of the plurality of circular gasket seals.

13. The gas distribution plate of claim 12, further comprising:

a third ring shaped porous insert covering the third circle of the third plurality of gas holes of the second zone.

14. The gas distribution plate of claim 12, wherein the first ring shaped porous insert is an electrically conductive material.

15. The gas distribution plate of claim 12, wherein the first ring shaped porous insert has an average pore size of between about 5 micrometers and about 120 micrometers.

16. The gas distribution plate of claim 12, wherein the first ring shaped porous insert is a dielectric material.

17. The gas distribution plate of claim 12, wherein the first ring shaped porous insert has a porosity of between about 20% and about 70%.

18. The gas distribution plate of claim 12, wherein the gas distribution plate comprises a silicon containing material.

19. The gas distribution plate of claim 13, wherein the second porous insert is a conductive material.

20. The gas distribution plate of claim 13, wherein the second porous insert is a dielectric material.

\* \* \* \* \*